(12) United States Patent
Eckert (10) Patent No.: US 9,608,409 B2
(45) Date of Patent: Mar. 28, 2017

(54) LASER COMPONENT ASSEMBLY AND METHOD OF PRODUCING A LASER COMPONENT

(71) Applicant: OSRAM Opto Semiconductors GmbH, Regensburg (DE)

(72) Inventor: Tilman Eckert, Tanjung Tokong (MY)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 14/912,196

(22) PCT Filed: Aug. 14, 2014

(86) PCT No.: PCT/EP2014/067438
§ 371 (c)(1),
(2) Date: Feb. 16, 2016

(87) PCT Pub. No.: WO2015/024861
PCT Pub. Date: Feb. 26, 2015

(65) Prior Publication Data
US 2016/0190770 A1 Jun. 30, 2016

(30) Foreign Application Priority Data

Aug. 21, 2013 (DE) ........................ 10 2013 216 525

(51) Int. Cl.
*G02B 7/02* (2006.01)
*H01S 3/04* (2006.01)
(Continued)

(52) U.S. Cl.
CPC ............ *H01S 5/4031* (2013.01); *G02B 7/025* (2013.01); *G02B 27/0966* (2013.01);
(Continued)

(58) Field of Classification Search
CPC .. H01S 5/4031; H01S 5/0201; H01S 5/02252; H01S 5/02272; H01S 5/02288; H01S 5/4025; G02B 7/025; G02B 27/0966
(Continued)

(56) References Cited

U.S. PATENT DOCUMENTS 5,500,869 A    3/1996  Yoshida et al.
5,888,841 A    3/1999  Synder
(Continued)

FOREIGN PATENT DOCUMENTS

DE    692 04 135 T2    4/1996
DE    197 06 276 A1    8/1998
(Continued)

*Primary Examiner* — William Choi
(74) *Attorney, Agent, or Firm* — DLA Piper LLP (US)

(57) ABSTRACT

A laser component assembly includes a carrier including first and second component portions wherein each component portion has a chip mounting surface, a lens mounting surface and a stop surface, the stop surface of each component portion includes first and second stop partial surfaces, the first stop partial surface is formed on a first stop element and the second stop partial surface is formed on a second stop element, the chip mounting surface is arranged between the first stop element and the second stop element, the stop surface is oriented perpendicularly to the chip mounting surface, a laser chip arranged on the chip mounting surface, the laser component assembly as a lens bar comprising an optical lens component portion and the lens bar is arranged on the lens mounting surfaces of the component portions and bears against the stop surfaces of the component portions.

17 Claims, 8 Drawing Sheets (51) Int. Cl.
  *H01S 5/40* (2006.01)
  *G02B 27/09* (2006.01)
  *H01S 5/022* (2006.01)
  *H01S 5/02* (2006.01)

(52) U.S. Cl.
  CPC ........ *H01S 5/0201* (2013.01); *H01S 5/02252* (2013.01); *H01S 5/02272* (2013.01); *H01S 5/02288* (2013.01); *H01S 5/4025* (2013.01)

(58) Field of Classification Search
  USPC .................................. 359/738, 819; 372/36
  See application file for complete search history.

(56) References Cited

U.S. PATENT DOCUMENTS

| | | |
|---|---|---|
| 5,963,577 A | 10/1999 | Snyder et al. |
| 6,160,672 A | 12/2000 | Chan et al. |
| 2003/0048819 A1 | 3/2003 | Nagano et al. |
| 2004/0114648 A1 | 6/2004 | Nagano et al. |
| 2008/0054076 A1 | 3/2008 | Schleuning et al. |

FOREIGN PATENT DOCUMENTS

| | | |
|---|---|---|
| DE | 10 2008 061 309 A1 | 6/2010 |
| DE | 10 2012 215 684 A1 | 3/2014 |
| EP | 0 984 312 A2 | 3/2000 |
| JP | 06-196816 A | 7/1994 |

LASER COMPONENT ASSEMBLY AND METHOD OF PRODUCING A LASER COMPONENT

TECHNICAL FIELD

This disclosure relates to a laser component assembly and a method of producing a laser component.

BACKGROUND

Laser components comprising semiconductor-based laser chips (diode lasers) are known. Edge emitting laser chips generate highly divergent laser beams. It is known to equip laser components with optical lenses provided to collimate divergent laser beams. Due to the high beam divergence, the optical lenses either have to be made very large or have to be arranged very near the laser chip. The nearer to the chip the optical lens is arranged, the more stringent the requirements made of the positioning accuracy of the optical lens. Even slight inaccuracies in the position and orientation of the optical lens result in a severe impairment of the optical properties of the laser component.

It could therefore be helpful to provide an improved laser component assembly and a method of producing such a laser component.

SUMMARY

I provide a laser component assembly including a carrier including a first component portion and a second component portion, wherein each component portion has a chip mounting surface, a lens mounting surface and a stop surface, the stop surface of each component portion includes a first stop partial surface and a second stop partial surface, the first stop partial surface is formed on a first stop element and the second stop partial surface is formed on a second stop element, the chip mounting surface is arranged between the first stop element and the second stop element, the stop surface is oriented perpendicularly to the chip mounting surface, a laser chip is arranged on the chip mounting surface, the laser component assembly has a lens bar including an optical lens per component portion, and the lens bar is arranged on the lens mounting surfaces of the component portions and bears against the stop surfaces of the component portions.

I also provide a method of producing a laser component including providing a carrier including a chip mounting surface, a further chip mounting surface, a lens mounting surface, a further lens mounting surface, a stop surface and a further stop surface' arranging a laser chip on the chip mounting surface and a further laser chip on the further chip mounting surface; arranging a lens bar including an optical lens and a further optical lens on the lens mounting surface and the further lens mounting surface, wherein the lens bar bears against the stop surface and against the further stop surface; and dividing the carrier and the lens bar to obtain a first laser component and a second laser component.

LIST OF REFERENCE SIGNS

100 Carrier
101 Perpendicular direction
102 Transverse direction
103 Forward direction
110 Component strip
111 First component strip
112 Second component strip
120 Component portion
121 First component portion
122 Second component portion
130 First side boundary
140 Second side boundary
150 Stop block
151 First stop element
152 Second stop element
155 Stop surface
156 First stop partial surface
157 Second stop partial surface
160 Chip mounting surface
170 Lens mounting surface
180 First metallization
181 Metallization of the chip mounting surface
182 Metallization of the lens mounting surface
190 Second metallization
200 Laser chip
201 Top side
202 Underside
203 Emission face
210 Bond wire
300 Lens bar
301 Plane side
302 Curved side
303 Top side
304 Underside
305 First end side
306 Second end side
307 Axis of curvature
308 Bearing region
309 Coupling-in region
310 Optical lens
320 Adhesive
400 Pressing-on tool
500 Laser component
510 First electrical contact pad
520 Second electrical contact pad
530 Cavity

DETAILED DESCRIPTION

My laser component assembly comprises a carrier comprising a first component portion and a second component portion, wherein each component portion has a chip mounting surface, a lens mounting surface and a stop surface. The stop surface is oriented perpendicular to the chip mounting surface. A laser chip is arranged on the chip mounting surface. Moreover, the laser component assembly has a lens bar comprising an optical lens per component portion. The lens bar is arranged on the lens mounting surfaces of the component portions and bears against the stop surfaces of the component portions. By dividing the laser component assembly, a plurality of laser components are obtainable from the laser component assembly. Advantageously, the positions of the optical lenses of the lens bar in this laser component assembly are defined very accurately relative to the carrier by the lens bar bearing against the stop surfaces. This results in an accurately defined relative positioning of the laser chips and the optical lenses of the lens bar with respect to one another. As a result, the optical lenses of the laser components obtainable from this laser component assembly can advantageously bring about a high-quality beam shaping of a laser beam emitted by the respective laser chips of the laser components.

The stop surface of each component portion may comprise a first stop partial surface and a second stop partial surface. In this case, the first stop partial surface is formed on a first stop element and the second stop partial surface is formed on a second stop element. The chip mounting surface is arranged between the first stop element and the second stop element. Advantageously, this defines not only the position of the optical lens in relation to the carrier and the laser chip, but also the orientation (angular position) of the optical lens in relation to the carrier and the laser chip. The arrangement of the stop partial surfaces on both sides of the chip mounting surface and of the laser chip advantageously minimizes the effects of possible tolerances. The high accuracy of the positioning and orientation of the optical lens enables a high-quality beam shaping by the optical lens for each of the laser components obtainable from the laser component assembly.

The lens bar may be spaced apart from the laser chips. The distance between the radiation emission faces of the laser chips and the optical lenses of the lens bar can have a value defined with high accuracy. As a result, in each of the laser components obtainable from the laser component assembly, the laser chip and the optical lens advantageously form a high-quality optical system. The distance between the lens bar and the laser chips advantageously prevents damage to the laser chips by the lens bar during production of the laser component assembly.

The lens bar may be a planoconvex lens. In this case, a plane side of the lens bar faces the laser chips. Advantageously, as a result, a region of the lens bar bearing against the stop surfaces can also be planar. This enables a particularly accurate alignment of the lens bar relative to the carrier and the laser chips.

The lens bar may be a planoconvex cylindrical lens. In this case, an axis of curvature of the lens bar is oriented parallel to the chip mounting surfaces. As a result, the axis of curvature of the lens bar is advantageously also oriented substantially parallel to preferred axes of the laser chips. The optical lenses (cylindrical lenses) of the laser components obtainable from the laser component assembly are thus able to collimate a laser beam emitted by the laser chip of the respective laser component in a spatial direction.

In each component portion, the laser chip may be an edge emitting laser chip. In this case, a laser beam that can be emitted by the respective laser chip has a higher beam divergence in a direction perpendicular to the chip mounting surface than in a direction parallel to the chip mounting surface. By way of example, a so-called "slow axis" of the laser chip can be oriented parallel to the chip mounting surface and a so-called "fast axis" of the laser chip can be oriented perpendicular to the chip mounting surface. Advantageously, the use of a planoconvex cylindrical optical lens thereby makes it possible, in each laser component obtainable from the laser component assembly, to correct the high divergence of the laser beam that can be emitted by the respective laser chip in the direction perpendicular to the chip mounting surface.

In each component portion, the chip mounting surface may be arranged parallel to the lens mounting surface. Advantageously, this results in a simple mutual alignment between the lens bar and the laser chips of the laser component assembly.

In each component portion, the chip mounting surface may be elevated relative to the lens mounting surface. This enables the lens bar to be made higher than the laser chips in the direction perpendicular to the chip mounting surfaces. As a result of the elevated arrangement of the chip mounting surfaces relative to the lens mounting surfaces, the optical lenses of the lens bar can nevertheless be optimally arranged with respect to the laser chips.

In each component portion, a first metallization may be arranged on the chip mounting surface. In this case, the laser chip in each component portion electrically conductively connects to the respective first metallization. This advantageously makes it possible to apply electrical voltage to the laser chip in each laser component obtainable from the laser component assembly via the first metallization.

In each component portion, a metallization may be arranged on the lens mounting surface, the metallization electrically conductively connecting to the respective first metallization. This advantageously makes it possible to apply electrical voltage to the laser chip in each laser component obtainable from the laser component assembly via metallization of the lens mounting surface.

The carrier may have a second metallization in each component portion, the second metallization being electrically insulated from the first metallization. In this case, the laser chip in each component portion electrically conductively connects to the respective second metallization. This makes it possible to apply electrical voltage and electrical current to the laser chip in each laser component obtainable from the laser component assembly via the second metallization. In particular, between the first and second metallizations of each laser component obtainable from the laser component assembly, an electrical voltage can be applied to the laser chips of the respective laser component.

A method of producing a laser component comprises steps of providing a carrier comprising a chip mounting surface, a further chip mounting surface, a lens mounting surface, a further lens mounting surface, a stop surface and a further stop surface, to arrange a laser chip on the chip mounting surface and a further laser chip on the further chip mounting surface, and to arrange a lens bar comprising an optical lens and a further optical lens, on the lens mounting surface and the further lens mounting surface, wherein the lens bar bears against the stop surface and the further stop surface. This method advantageously enables precise alignment of the optical lenses of the lens bar with the carrier of the laser component. This can also result in exact positioning of the optical lenses with respect to the laser chips of the laser components. The method thus makes it possible to produce laser components with high optical quality. In this case, in particular, no method steps to actively adjust the optical lenses of the laser components are required. As a result, the method can advantageously be carried out simply, rapidly and cost-effectively. The arrangement of the lens bar can advantageously be carried out in a two-stage process in which the lens bar is first placed on the carrier with comparatively low accuracy. This sub-step can advantageously be carried out rapidly and simply. Afterward, the lens bar is displaced such that it bears against the stop surface and the further stop surface of the carrier, which can result in a very accurate alignment of the optical lenses. By virtue of the fact that the lens bar comprising the two optical lenses bears against two stop surfaces, inaccuracies resulting from possible tolerances are advantageously minimized. The method advantageously enables parallel production of a plurality of laser components, as a result of which the production costs per individual laser component decrease.

An adhesive may be arranged on the lens mounting surface before the lens bar is arranged on the lens mounting surface. The adhesive can be, for example, a standard adhesive obtainable in a cost-effective manner. The adhesive can be applied according to a simple standard method that can be carried out in a cost-effective manner. After arranging and aligning the lens bar, a further method step of curing the adhesive can be carried out. The adhesive can be cured thermally, for example.

The lens bar, after being arranged on the lens mounting surface, may be pressed onto the stop surface and the further stop surface. As a result, the lens bar, after being placed onto the lens mounting surface, can be aligned precisely with the carrier.

The pressing-on may be effected in a force-controlled manner. In this case, the pressing-on can be effected by a mechanically inelastic tool, for example.

The pressing-on may be effected in a distance-controlled manner. Advantageously, as a result, the method does not require a force measurement in directions parallel to the lens mounting surface. This makes it possible to carry out pressing-on the lens bar simply and cost-effectively.

The lens bar may be pressed onto the stop surface and the further stop surface by an elastically compliant tool. Advantageously, even in distance-controlled pressing-on of the lens bar, this prevents inadvertent damage to the lens bar or other parts of the laser component obtainable by the method.

The method may comprise a further step of dividing the carrier and the lens bar to obtain a first laser component and a second laser component. As a result, the method advantageously enables parallel production of a plurality of laser components, as a result of which production costs per individual laser component are drastically reduced.

The above-described properties, features and advantages and the way in which they are achieved will become clearer and more clearly understood in association with the following description of the examples explained in greater detail in association with the drawings.

Figure 1:
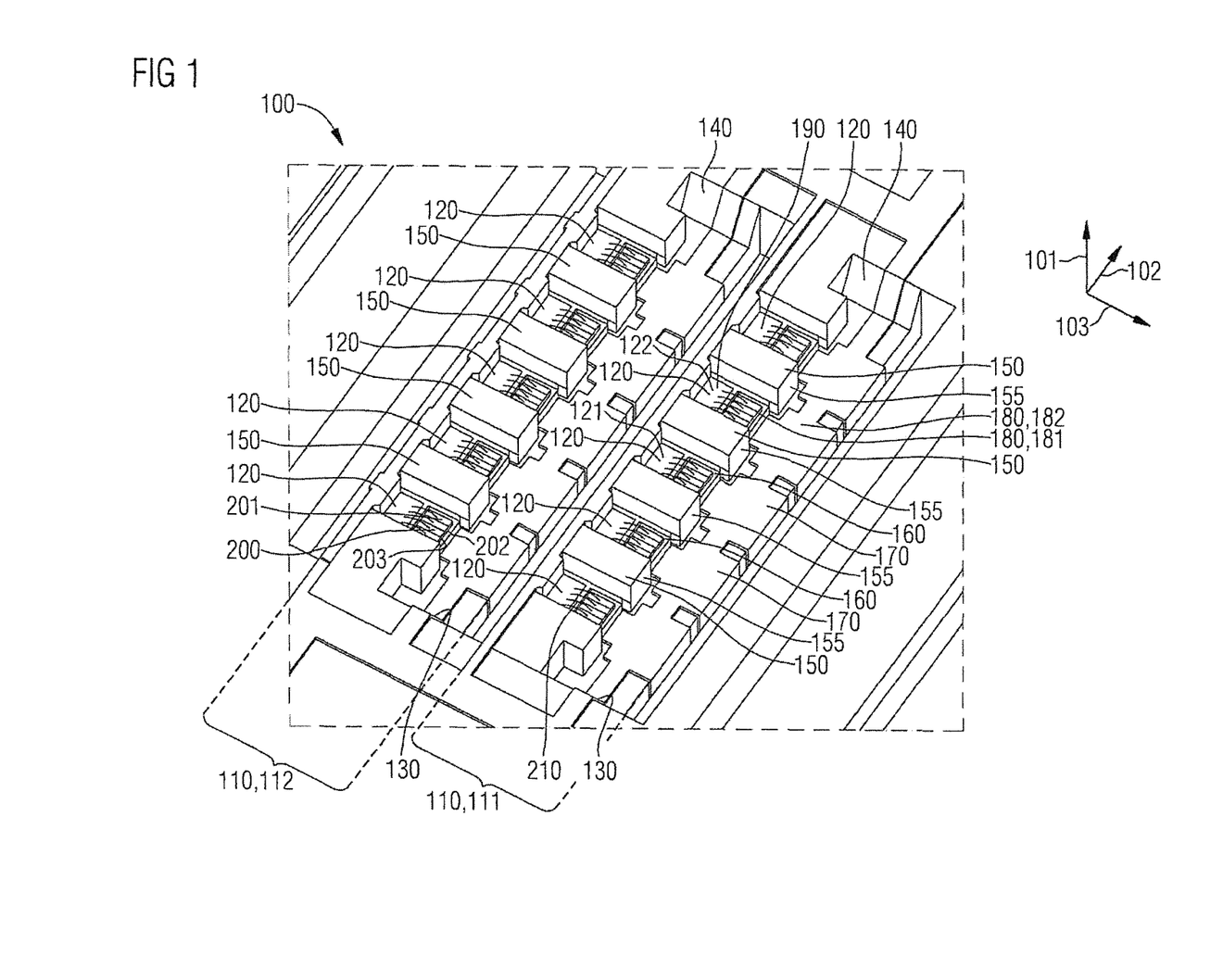
FIG. 1 shows a perspective view of a carrier.

FIG. 1 shows a slightly schematic perspective illustration of part of a carrier 100. The carrier 100 produces a plurality of laser components. The carrier 100 has a top side. A perpendicular direction 101 is oriented perpendicular to the top side of the carrier 100.

A plurality of component strips 110 are arranged on the top side of the carrier 100. In the example shown in FIG. 1, the component strips 110 comprise a first component strip 111 and a second component strip 112. However, it is also possible to provide only one component strip 110 or more than two component strips 110.

The component strips 110 extend on the top side of the carrier 100 in a transverse direction 102 oriented parallel to the top side of the carrier 100. The individual component strips 110 of the carrier 100 are arranged alongside one another in a forward direction 103 oriented parallel to the surface of the carrier 100 and perpendicular to the transverse direction 102.

The component strips 110 comprise a plurality of component portions 120. In the example shown in FIG. 1, each component strip 110 comprises five component portions 120. However, it is also possible for the component strips 110 to have fewer or more than five component portions 120. The component portions 120 of a component strip 110 are arranged one behind another in the transverse direction 102. Consequently, the two component strips 111, 112 of the carrier 100 form two mutually parallel strips having five component portions 120.

The component portions 120 are substantially all identical. The first component strip 111 comprises a first component portion 121 picked out by way of example and a second component portion 122 adjacent to the first component portion 121.

Each component portion 120 has a chip mounting surface 160 and a lens mounting surface 170. The chip mounting surface 160 and the lens mounting surface 170 are oriented parallel to the top side of the carrier 100, that is to say perpendicular to the perpendicular direction 101. The lens mounting surface 170 of each component portion 120 is arranged in front of the associated chip mounting surface 160 of the respective component portion 120 in the forward direction 103. The chip mounting surface 160 is preferably elevated relative to the associated lens mounting surface 170 in the perpendicular direction 101. This is not absolutely necessary, however.

The chip mounting surfaces 160 of the individual component portions 120 of a component strip 110 are separated from one another by stop blocks 150. A stop block 150 is also arranged in front of the first component portion 120 and behind the last component portion 120 of each component strip 110. The stop blocks 150 project beyond the chip mounting surfaces 160 in the perpendicular direction 101. The stop blocks 150 can be a parallelepipedal, for example.

Each stop block 150 has a stop surface 155. The stop surfaces 155 are oriented perpendicularly to the forward direction 103, that is to say lie parallel to a plane spanned by the perpendicular direction 101 and the transverse direction 102. In this case, the stop surfaces 155 point from the chip mounting surfaces 160 in the direction of the lens mounting surfaces 170. Each chip mounting surface 160 is set back slightly relative to the stop surfaces 155 of the two stop blocks 150 adjacent to the respective chip mounting surface 160.

A first side boundary 130 is formed at a first longitudinal end of each component strip 110. At a second longitudinal end opposite the first longitudinal end in the transverse direction 102, each component strip 110 has a second side boundary 140. The lens mounting surfaces 170 of the respective component strip 110 are lined up one behind another between the first side boundary 130 and the second side boundary 140. At the first side boundary 130 and at the second side boundary 140, the level rises from the level of the lens mounting surfaces 170 in the perpendicular direction 101. The first side boundary 130 is thus formed by an area pointing proportionally in the perpendicular direction 101 and the positive transverse direction 102. The forward direction 103 is oriented parallel to the area of the first side boundary 130. The second side boundary 140 is formed by an area pointing proportionally in the perpendicular direction 101 and the negative transverse direction 102. The forward direction 103 is also oriented parallel to the area of the second side boundary 140. The chamfers of the first side boundary 130 and of the second side boundary 140 can have an angle of 45°, for example.

Each component portion 120 of each component strip 110 of the carrier 100 has a first metallization 180. The first metallization 180 of each component portion 120 comprises a metallization 181 on the surface of the respective chip mounting surface 160 and a metallization 182 on the surface of the respective lens mounting surface 170. The metallization 181 of the chip mounting surface 160 in each component portion 120 electrically conductively connects to the metallization 182 of the associated lens mounting surface 170. The metallizations 181, 182 of each component portion 120 jointly form the first metallization 180 of the respective component portion 120.

The metallizations 182 of the lens mounting surfaces 170 of all the component portions 120 of a component strip 110 can electrically conductively connect to one another. This can simplify production of the first metallization 180, for example, production by electrolytic thickening. However, the first metallizations 180 of the component portions 120 of each component strip 110 can also be electrically isolated from one another. If the first metallizations 180 of the individual component portions 120 of a component strip 110 connect to one another, then the first metallization 180 can have constrictions in the transition regions between the individual component portions 120, as in FIG. 1. This allows the first metallizations 180 of adjacent component portions 120 of a component strip 110 to be separated from one another in a subsequent sawing process, without severe burrs being formed in the process.

Alongside the first metallization 180, each component portion 120 of each component strip 110 has a second metallization 190. The second metallization 190 is electrically isolated from the first metallization 180. The second metallization 190 in each component portion 120 is arranged behind the metallization 181 of the chip mounting surface 160 in the forward direction 103, that is to say on that side of the metallization 181 of the chip mounting surface 160 facing away from the lens mounting surface 170. The second metallizations 190 of all the component portions 120 of a component strip 110 can also electrically conductively connect to one another.

A laser chip 200 is arranged in the component portion 120 of each component strip 110 of the carrier 100. The laser chips 200 are semiconductor-based laser chips (laser diodes). In this case, the laser chips 200 are edge emitters. The laser chips 200 emit laser beams.

Each laser chip 200 has a top side 201 and an underside 202 opposite the top side 201. Furthermore, each laser chip 200 has an emission face 202 oriented perpendicularly to the top side 201 and underside 202. During operation of the laser chips 200, a laser beam is emitted at the emission face 203 of the respective laser chip 200 in a direction perpendicular to the emission face 203.

The laser chips 200 are arranged on the chip mounting surfaces 160 of the component portions 120 such that the undersides 202 of the laser chips 200 face the chip mounting surfaces 160. In this case, a lower electrical contact pad of the laser chip 200, the lower electrical contact pad being formed on the underside 202 of the respective laser chip 200, electrically conductively connects to the first metallization 180, 181 of the chip mounting surface 160 of the respective component portion 120. Each laser chip 200 can be fixed to the respective chip mounting surface 160 by a solder, for example. In this case, the solder also establishes an electrically conductive connection between the lower electrical contact pad on the underside 202 of the respective laser chip 200 and the first metallization 180, 181 of the respective chip mounting surface 160.

The laser chips 200 are arranged on the chip mounting surfaces 160 of the component portions 120 such that the emission face 203 of each laser chip 200 points in the forward direction 103, that is to say in the direction of the lens mounting surface 170 of the respective component portion 120. The forward direction 103 is thus perpendicular to the emission face 203 of each laser chip 200.

The laser chips 200 are preferably arranged on the chip mounting surfaces 160 of the component portions 120 such that the emission face 203 of each laser chip 200 is arranged at a defined position in the forward direction 103, that is to say has a defined distance from the boundary between the chip mounting surface 160 and the lens mounting surface 170 of the respective component portion 120. This can be achieved, for example, by optical referencing to defined positions of the stop blocks 150 and/or the stop surfaces 155 thereof being carried out during the process of arranging the laser chips 200 on the chip mounting surfaces 160 of the component portions 120.

Each laser chip 200 has an upper electrical contact pad on its top side 201. In each laser chip 200, the upper electrical contact pad on the top side 201 electrically conductively connects to the second metallization 190 of the respective component portion 120 by one or a plurality of bond wires 210.

Figure 2:
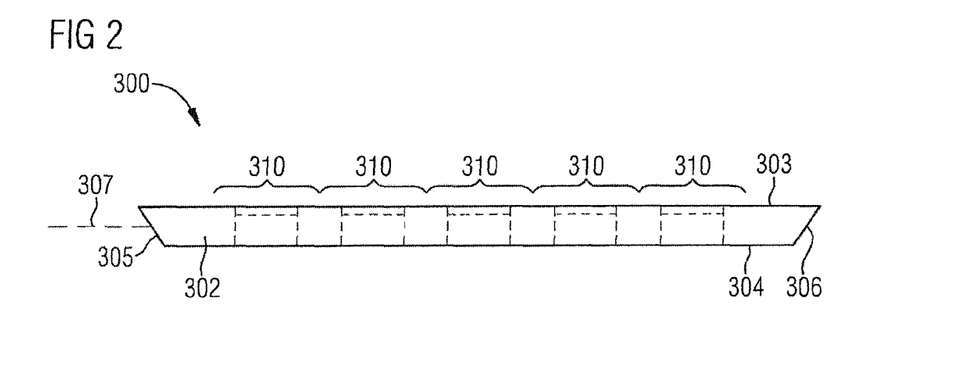
FIG. 2 shows a front view of a lens bar.
Figure 3:
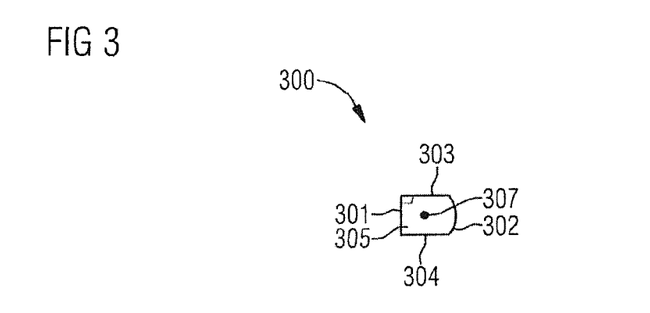
FIG. 3 shows a side view of the lens bar.
Figure 4:
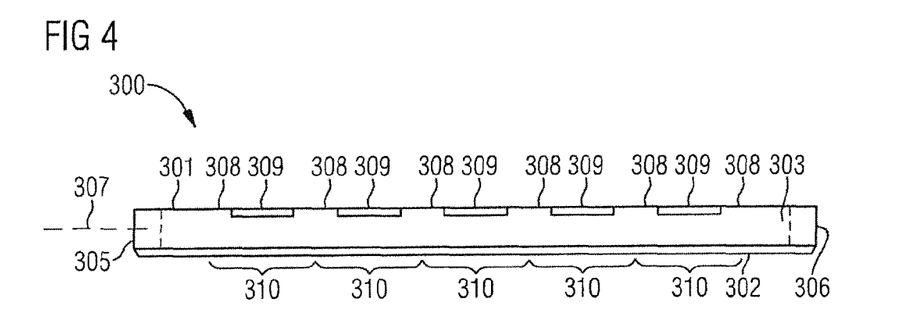
FIG. 4 shows a plan view of the lens bar.
Figure 5:
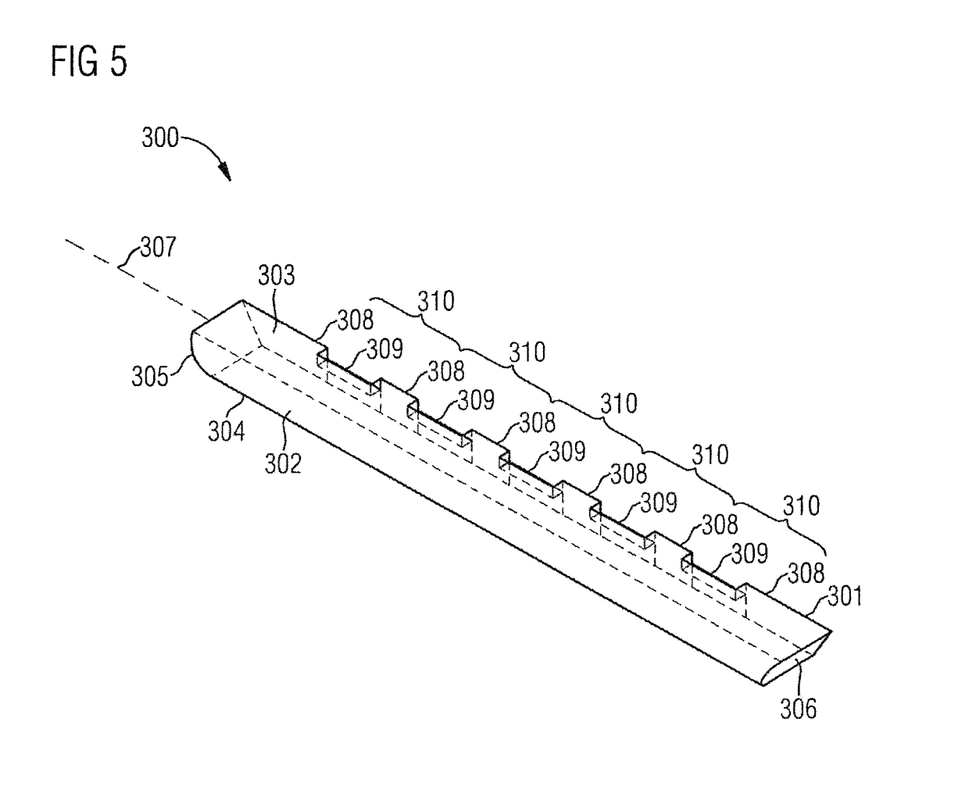
FIG. 5 shows a perspective illustration of the lens bar.

FIG. 2 shows a schematic front view of a lens bar 300. FIG. 3 shows a schematic side view of the lens bar 300. FIG. 4 shows a schematic plan view of the lens bar 300. FIG. 5 shows a schematic perspective illustration of the lens bar 300.

The lens bar 300 is an elongate bar and formed by a plurality of optical lenses 310 arranged integrally continuously one behind another. In the example illustrated, the lens bar 300 is formed by five optical lenses 310. However, the lens bar 300 can also comprise fewer or more than five optical lenses 310. In addition to the optical lenses 310, the lens bar 300 has end pieces at its two longitudinal ends. The lens bar 300 comprises an optically transparent and optically refractive material, for example, a glass or a plastic.

The lens bar 300 has a plane side 301 and a curved side 302 opposite the plane side 301. The plane side 301 and the curved side 302 are oriented parallel to the longitudinal direction of the lens bar 300. The curved side 302 of the lens bar 300 is curved convexly about an axis 307 of curvature oriented in the longitudinal direction of the lens bar 300. The lens bar 300 thus forms a planoconvex cylindrical lens. The individual optical lenses 310 of the lens bar 300 also each form planoconvex cylindrical lenses.

The lens bar 300 furthermore has a top side 303 and an underside 304 opposite the top side 303. The top side 303 and the underside 304 are oriented parallel to the longitudinal direction of the lens bar 300. Furthermore, the lens bar 300 has a first end side 305 and a second end side 306 opposite the first end side 305. The first end side 305 and the second end side 306 terminate the lens bar 300 at its two longitudinal ends. In this case, the first end side 305 and the second end side 306 are chamfered such that the top side 303 of the lens bar 300 has a greater length than the underside 304 of the lens bar 300 in the longitudinal direction of the lens bar 300. The chamfer can have an angle of 45°, for example.

In each optical lens 310 of the lens bar 300, the plane side 301 of the lens bar 300 has a coupling-in region 309 arranged between two bearing regions 308 of the respective optical lens 310. Consequently, the plane side 301 of the lens bar 300 is subdivided into bearing regions 308 and coupling-in regions 309 that respectively alternate in the longitudinal direction. The coupling-in regions 309 are slightly set back relative to the bearing regions 308 in the direction of the curved side 302. Therefore, the plane side 301 of the lens bar 300 is not totally planar. However, the plane side 301 of the lens bar 300 does not have a curvature either in the bearing regions 308 or in the coupling-in regions 309. The plane side 301 is therefore formed by plane partial regions parallel to one another. The subdivision of the plane side 301 into bearing regions 308 and coupling-in regions 309 can also be omitted.

Figure 6:
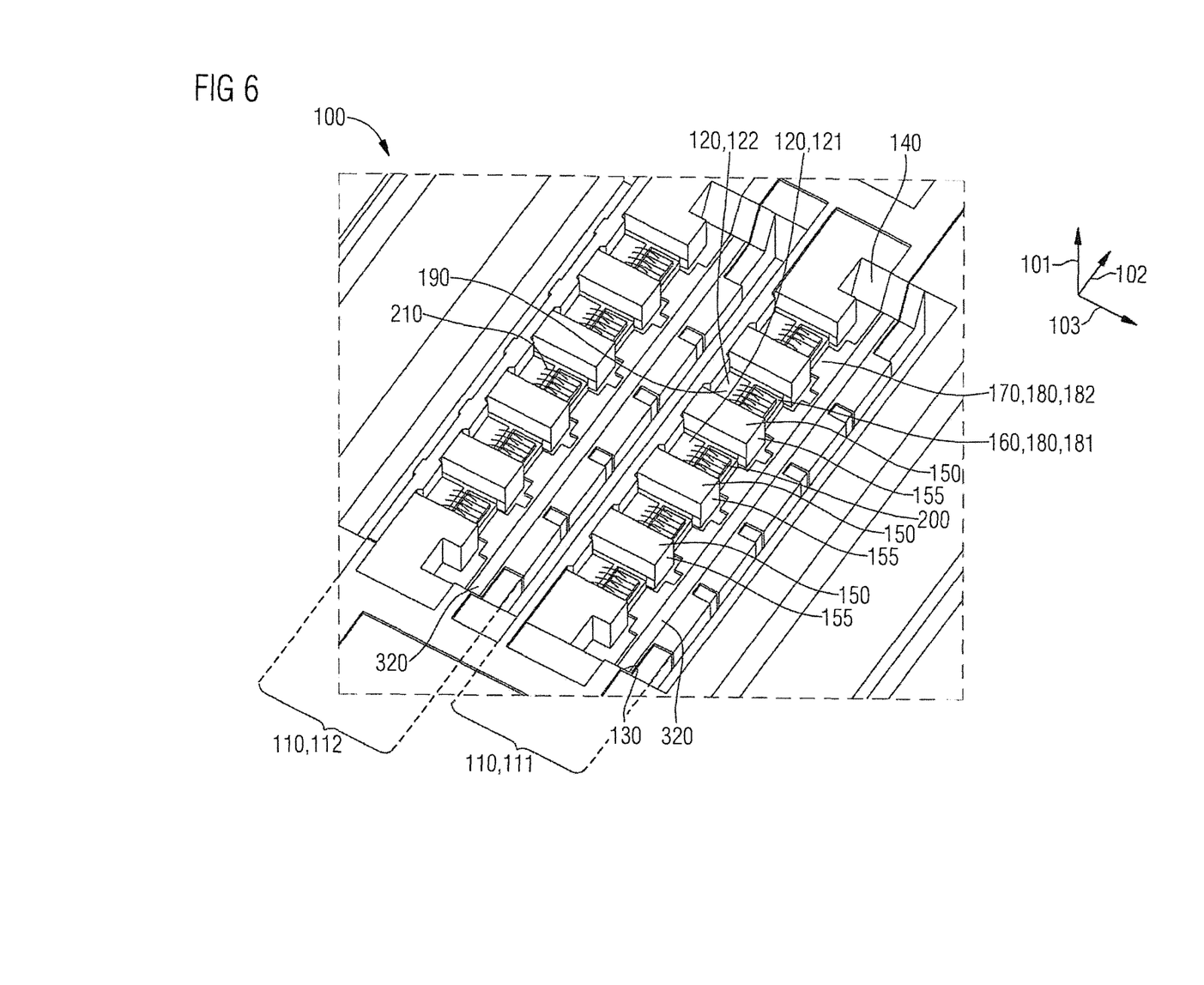
FIG. 6 shows a perspective view of the carrier with applied adhesive.

FIG. 6 shows a schematic perspective illustration of part of the carrier 100 in a processing state temporally succeeding the illustration in FIG. 1. In a work step carried out between the illustrations in FIGS. 1 and 6, an adhesive 320 has been applied to the lens mounting surfaces 170 of the component portions 120 of the component strips 110. The adhesive 320 can be a customary standard adhesive such as is usually used in the production of laser components.

In the example shown in FIG. 6, the adhesive 320 has been applied in strip form. In this case, in each component strip 110 a strip of the adhesive 320 extends in the transverse direction 102 over the lens mounting surfaces 170 of the component portions 120 of the respective component strip 110 that follow on behind one another. However, it is also possible to arrange the adhesive 320 individually on each lens mounting surface 170 of the component portions 120 of the component strips 110. The adhesive 320 can be arranged using a conventional method such as is customary in the production of laser components.

Figure 7:
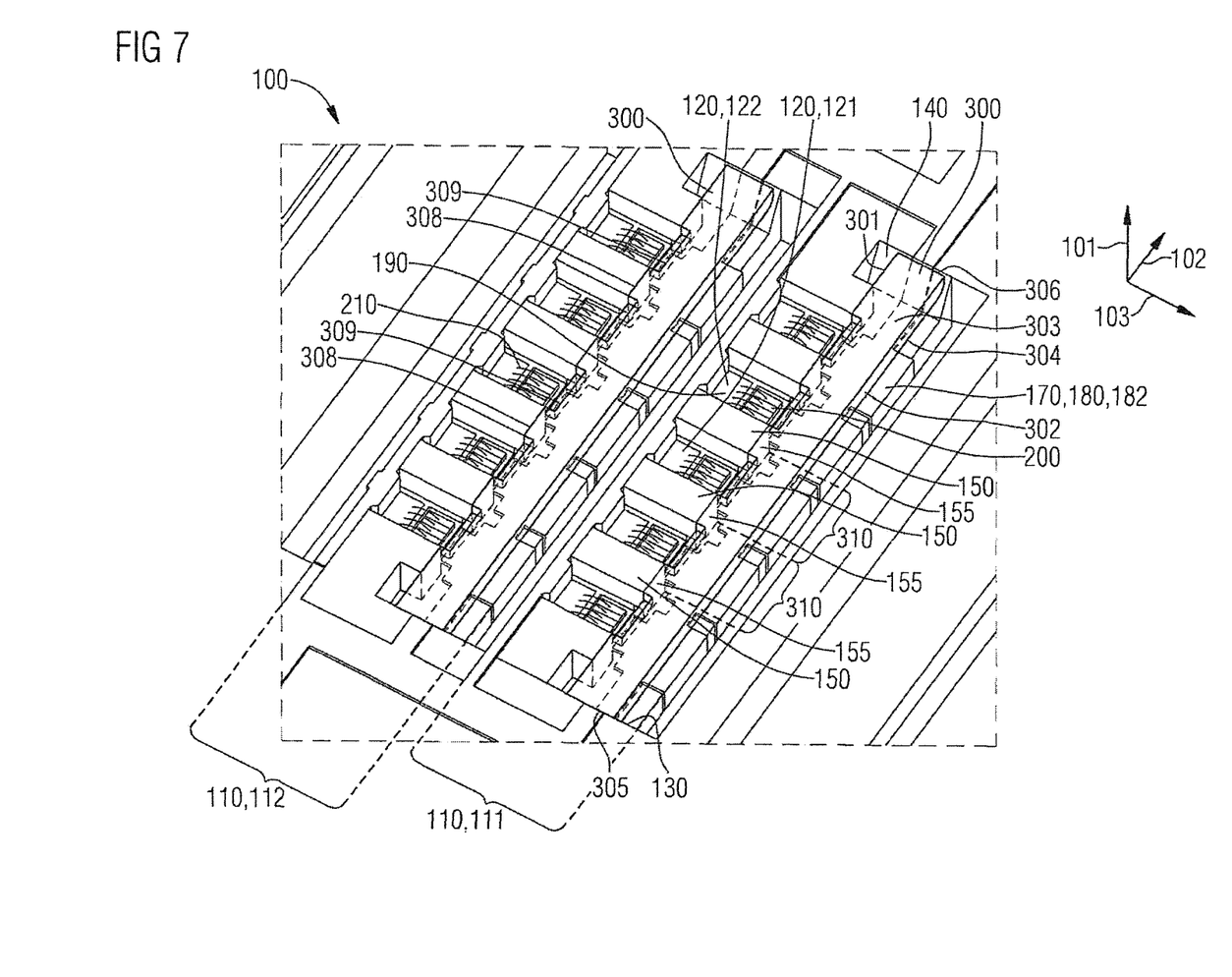
FIG. 7 shows a perspective view of the carrier with emplaced lens bar.

FIG. 7 shows a schematic perspective illustration of part of the carrier 100 in a processing state temporally succeeding the illustration in FIG. 6. In a processing step carried out between the illustrations in FIGS. 6 and 7, a lens bar 300 has been arranged on the component strips 110 of the carrier 100.

Each lens bar 300 is arranged on the lens mounting surfaces 170 of the component portions 120 of the respective component strip 110. The longitudinal direction of the lens bar 300 is oriented approximately parallel to the transverse direction 102 of the carrier 100. The plane side 301 of the lens bar 300 faces the stop surfaces 155 of the stop blocks 150 of the respective component strip 110. The underside 304 of the lens bar 300 faces the lens mounting surfaces 170 and is in contact with the adhesive 320.

In each of the lens bars 300, the first end side 305 faces the first side boundary 130 and the second end side 306 faces the second side boundary 140 of the respective component strip 110. In this case, the angles of the chamfered end sides 305, 306 of the lens bar 300 preferably correspond approximately to the angles of the chamfered side boundaries 130, 140. Preferably, the end sides 305, 306 of the lens bars 300 are slightly spaced apart from the side boundaries 130, 140 to enable the lens bars 300 to be slightly shifted in all spatial directions.

The arrangement of the lens bars on the component strips 110 of the carrier 100 may have been carried out by an automatic tool and with only low positioning accuracy. At the point in time of the arrangement of the lens bars 300, the adhesive 320 arranged on the lens mounting surfaces 170 of the component portions 120 of the component strips 110 has not yet cured and allows a displacement of the lens bars 300 even after arrangement of the lens bars 300.

Figure 8:
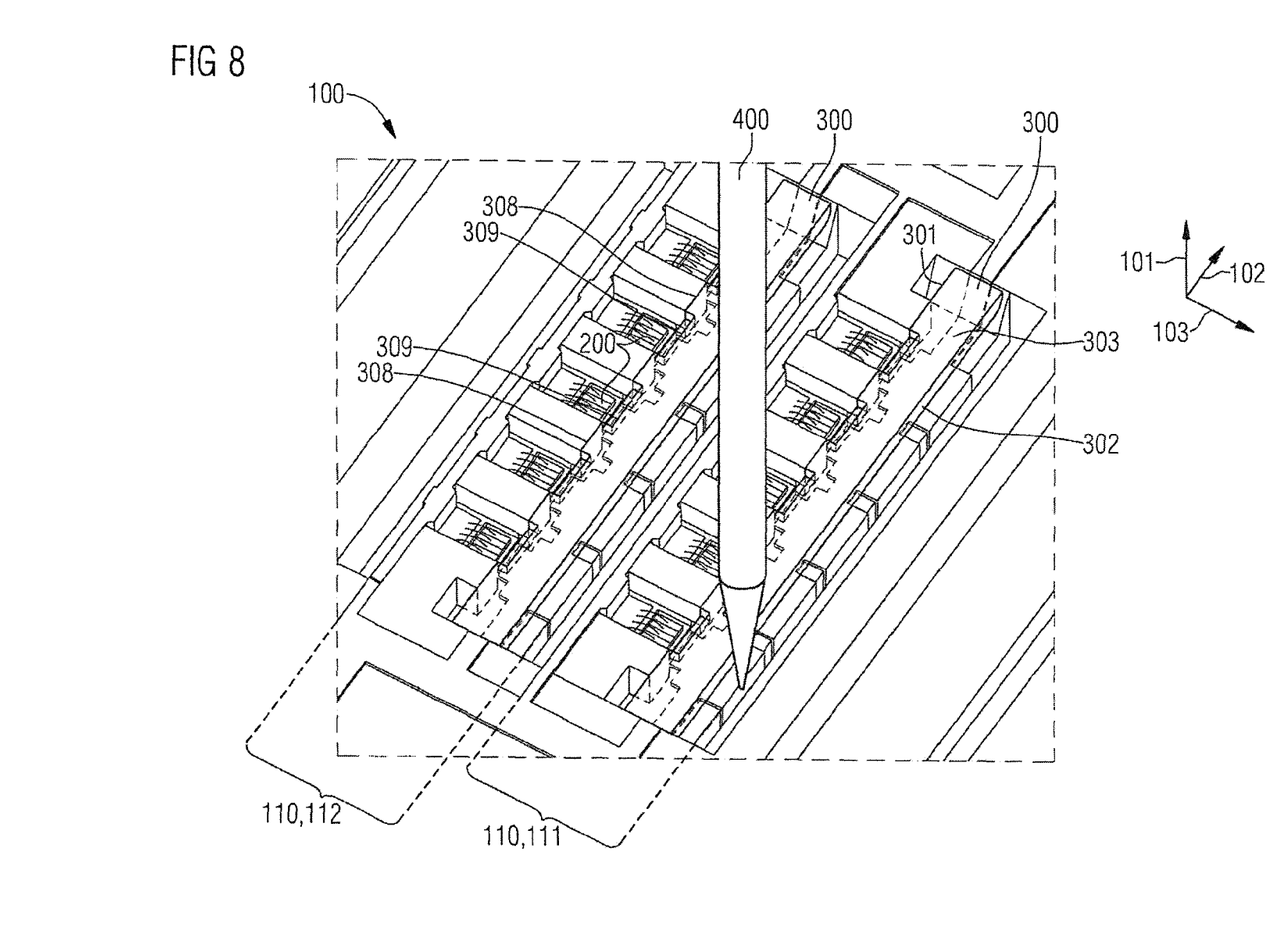
FIG. 8 shows a view of the carrier during pressing-on of one of the lens bars.

FIG. 8 shows a schematic perspective illustration of part of the carrier 300 during a processing step temporally succeeding the illustration in FIG. 7. During the processing step shown in FIG. 8, each lens bar 300 is displaced counter to the forward direction 103 of the carrier 100 and pressed onto the stop surfaces 155 of the stop blocks 150 of the respective component strip 110 of the carrier 100. An accurate positioning of the lens bars 300 relative to the carrier 100 and relative to the laser chips 200 is achieved as a result.

The lens bars 300 are displaced by a pressing-on tool 400, which is illustrated symbolically in FIG. 8. The pressing-on tool 400 acts on the curved side 302 of each lens bar 300 and presses the respective lens bar 300 counter to the forward direction 103 in the direction of the stop surfaces 155 of the stop blocks 150. In this case, the pressing-on tool 400 can act on each lens bar 300 just once. However, it is also possible for the pressing-on tool 400 to act on the lens bar 300 repeatedly at different positions in the longitudinal direction of the lens bar 300 (that is to say at different positions in the transverse direction 102) temporally successively.

The pressing-on tool 400 can be inelastic. In this case, displacement of the lens bar 300 by the pressing-on tool 400 can be effected in a force-controlled manner. In this case, the pressing-on tool 400 exerts a force on the lens bar 300 until a counterforce exerted on the pressing-on tool 400 by the lens bar 300 has reached a defined threshold value, which allows the conclusion to be drawn that the lens bar 300 now bears against the stop surfaces 155 of the stop blocks 150 of the respective component strip 110.

However, the pressing-on tool 400 can also be elastically compliant. In this case, displacement of the lens bars 300 by the pressing-on tool 400 can be effected in a distance-controlled manner. In this case, the pressing-on tool 400 bearing against the respective lens bar 300 is displaced by a defined path distance counter to the forward direction 103. Advantageously, it is not necessary to measure the forces exerted on the pressing-on tool 400 by the lens bar 300.

Figure 9:
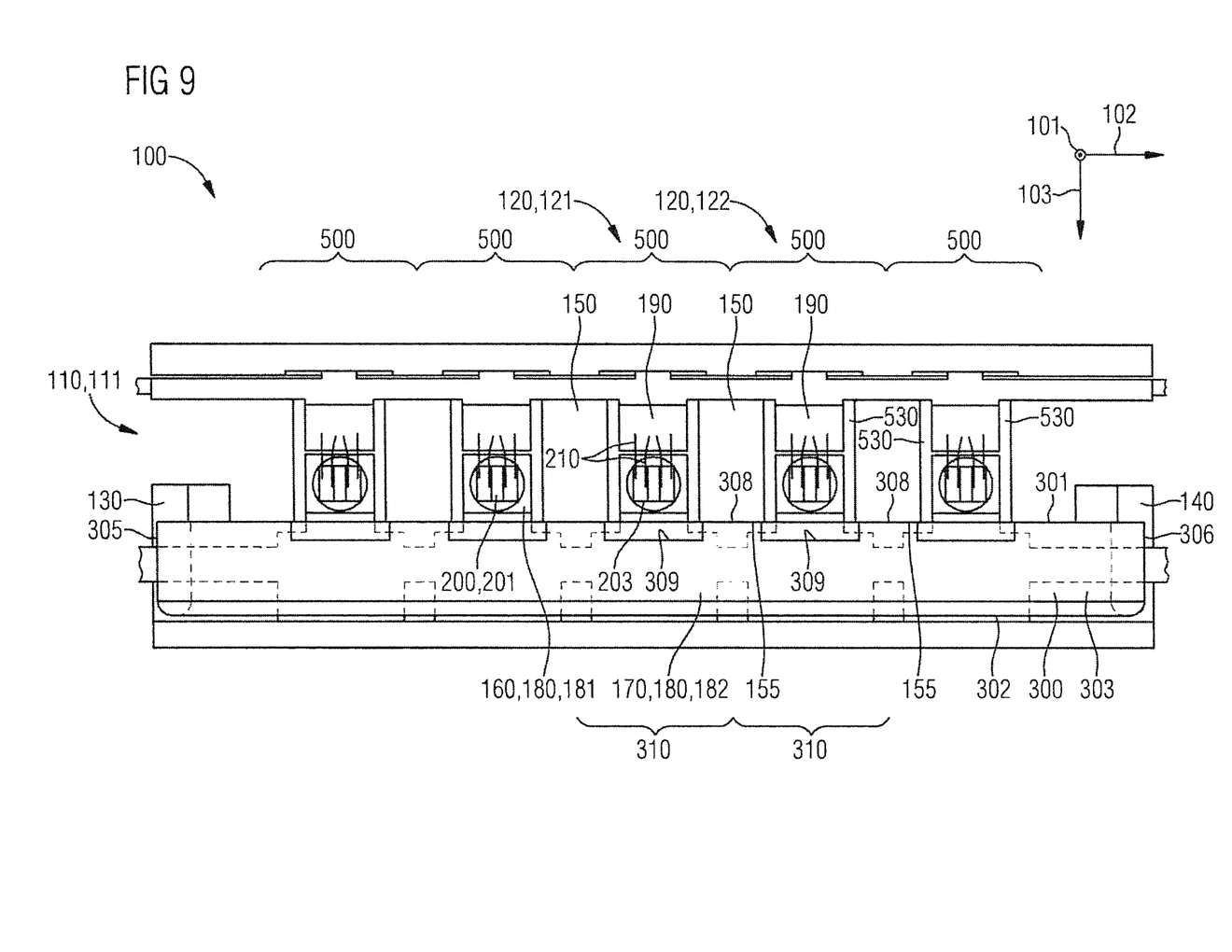
FIG. 9 shows a plan view of a component strip of the carrier.

FIG. 9 shows a schematic plan view of part of the carrier 100 in a processing state temporally succeeding the processing step in FIG. 8. Only the first component strip 111 is illustrated by way of example.

After displacement of the lens bar 300 by the pressing-on tool 400, the lens bar 300 is now arranged such that the plane side 301 of the lens bar 300 bears against the stop surfaces 155 of the stop blocks 150 of the first component strip 111. In this case, the bearing regions 308 of the plane side 301 of the lens bar 300 bear against the stop surfaces 155. As a result, the lens bar 300 has a position and orientation relative to the carrier 100 that are defined with high accuracy.

An optical lens 310 of the lens bar 300 is assigned to each component portion 120 of the first component strip 111. The coupling-in region 309 of the respective optical lens 310 faces the emission face 203 of the laser chip 200 of the respective component portion 120. The defined position and orientation of the lens bar 300 with respect to the carrier 100 and the defined position and orientation of the laser chip 200 with respect to the carrier 300 ensure that the coupling-in region 309 of each optical lens 310, with high accuracy, is oriented parallel to the emission face 203 of the associated laser chip 200 and has a defined distance from the emission face 203 of the associated laser chip 200.

After the lens bar 300 has been pressed onto the stop surfaces 155 of the stop blocks 150, a further processing step of curing the adhesive 320 can be carried out to finally fix the lens bar 300 in its position. The adhesive 320 can be cured by a thermal treatment, for example.

In a further processing step, the component portions 120 of each component strip 110 of the carrier 100 can be separated from one another to obtain individual laser components 500. In this case, the optical lenses of the lens bars 300 assigned to the component portions 120 are also separated from one another. Since a dedicated laser chip 200 is arranged on each of the component portions 120 and the individual laser chips 200 are not connected to one another, the sensitive laser chips 200 advantageously do not have to be separated from one another during the separation of the component portions 120. This makes it possible to separate the component portions 120 from one another by a simple, fast and cost-effective process. The component portions 120 and the optical lenses 310 can be separated by a sawing process, for example.

The component strips 110 with the lens bars 300 arranged thereon, the processing of the component strips being finished apart from the division of the individual component portions 120, can also be referred to as laser component assemblies since each such laser component assembly comprises a plurality of laser components 500 still connected to one another. Each such laser component assembly comprises a plurality of component portions 120 and a lens bar 300 having an optical lens 310 per component portion 120. Each of the component portions 120 has a chip mounting surface 160, a lens mounting surface 170 and a stop surface 155. The stop surface 155 is oriented perpendicular to the chip mounting surface 160. A laser chip 200 is arranged on the chip mounting surface 160. The lens bar 300 of the laser component assembly is arranged on the lens mounting surfaces 170 of the component portions 120 and bears against the stop surfaces 155 of the component portions 120.

Figure 10:
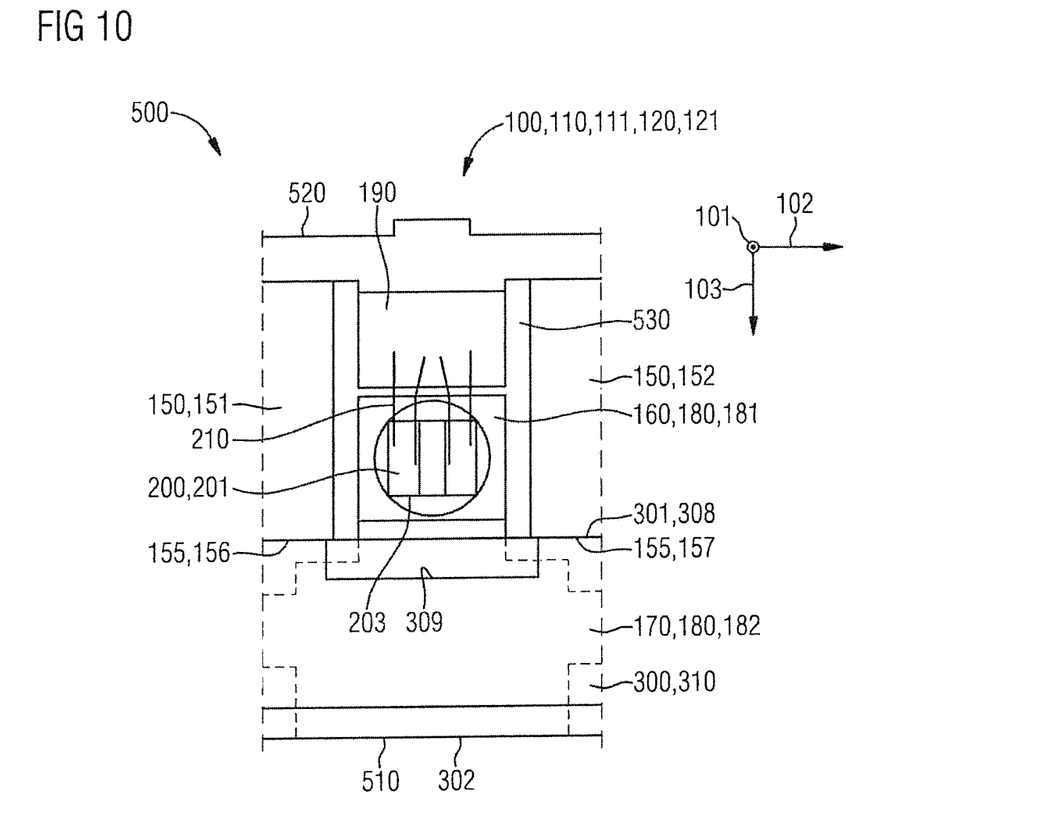
FIG. 10 shows a plan view of a laser component.

FIG. 10 shows a schematic plan view of one of the laser components 500 obtained by division of the carrier 100 and the lens bars 300. The laser component 500 illustrated by way of example in FIG. 10 is formed from the first component portion 121 of the first component strip 111 of the carrier 100 and an optical lens 310 (assigned to the first component portion 121) of one of the lens bars 300.

The first component portion 121 was separated from the component portions 120, 122 of the first component strip 111 adjacent to the first component portion 121 by two separating cuts. The separating cuts run parallel to the forward direction 103 and perpendicular to the transverse direction 102. The separating cuts extend through the two stop blocks 150 adjacent to the first component portion 121. The stop blocks 150 divided by the separating cuts form a first stop element 151 and a second stop element 152 of the laser component 500. The chip mounting surface 160 of the laser component 500 is arranged between the first stop element 151 and the second stop element 152.

A first stop partial surface 156 is formed from the stop surface 155 of the stop block 150 from which the first stop element 151 is formed. A second stop partial surface 157 is formed from the stop surface 155 of the stop block 150 from which the second stop element 152 is formed. The optical lens 310 of the laser component 500 bears against the first stop partial surface 156 and against the second stop partial surface 157.

The laser component 500 has a cavity 530 open on one side. The laser chip 200 of the laser component 500 is arranged in the cavity 530. The cavity 530 is delimited toward the bottom by the top side of the carrier 100, on two sides by the two stop elements 151, 152, in the forward direction 103 by the plane side 301 of the optical lens 310, and in the direction counter to the forward direction 103 by a wall of the carrier 100 that has a section of a second metallization 190.

The cavity 530 of the laser component 500 can be filled with a potting material. The laser chip 200 and the bond wires 210 are thereby protected against damage by external mechanical effects and against penetration of dirt and moisture. The potting material is preferably optically transparent. The potting material can comprise silicone, for example. The potting material can be introduced into the cavities 530 of all the component portions 120 of the carrier 100 already before the laser components 500 are singulated.

The laser component 500 has, on its underside pointing in the negative perpendicular direction 101, a first electrical contact pad 510 and a second electrical contact pad 520. The first electrical contact pad 510 electrically conductively connects to the first metallization 180 of the laser component 500. By way of example, the first metallization 180 can extend for this purpose over a front end side of the laser component 500 pointing in the forward direction 103. The second electrical contact pad 520 of the laser component 500 electrically conductively connects to the second metallization 190. The second metallization 190 can extend for this purpose over a rear end side of the laser component 500, opposite the front end side as far as the second electrical contact pad 520. The first electrical contact pad 510 and the second electrical contact pad 520 thus electrically conductively connect to the lower electrical contact pad and the upper electrical contact pad of the laser chip 200 of the laser component 500. Via the first electrical contact pad 510 and the second electrical contact pad 520, an electrical voltage can be applied to the laser chip 200 to cause the laser chip 200 to emit a laser beam.

The first electrical contact pad 510 and the second electrical contact pad 520 of the laser component 500 can be electrically contacted according to a method of surface mounting. The laser component 500 forms an SMD component in this case. By way of example, the first electrical contact pad 510 and the second electrical contact pad 520 of the laser component 500 can be electrically contacted by reflow soldering.

During operation of the laser component 500, the laser chip 200 emits a laser beam in the forward direction 103 at its emission face 203. The laser beam emitted by the laser chip 200 has a beam divergence. In this case, the laser beam emitted by the laser chip 200 can have a higher beam divergence in the perpendicular direction 101 than in the transverse direction 102. In this case, a fast axis of the laser chip 200 can be oriented in the perpendicular direction 101 and a slow axis of the laser chip 200 can be oriented in the transverse direction 102.

The optical lens 310 of the laser component 500 collimates the beam divergence of the laser beam emitted by the laser chip 200 in the perpendicular direction 101. The origin of the laser beam at the emission face 203 of the laser chip 200 lies for this purpose in the perpendicular direction 101 preferably approximately at the level of a plane of symmetry of the optical lens 310. This can be achieved by virtue of the fact that the chip mounting surface 160 of the laser component 500 is elevated relative to the lens mounting surface 170 of the laser component 500.

My assemblies and methods have been illustrated and described in greater detail on the basis of the preferred examples. Nevertheless, this disclosure is not restricted to the examples disclosed. Rather, other variations can be derived therefrom by those skilled in the art without departing from the scope of protection of the appended claims.

This application claims priority of DE 10 2013 216 525.0, the disclosure of which is incorporated herein by reference.

The invention claimed is:

1. A laser component assembly comprising:
   a carrier comprising a first component portion and a second component portion,
   wherein each component portion has a chip mounting surface, a lens mounting surface and a stop surface,
   the stop surface of each component portion comprises a first stop partial surface and a second stop partial surface,
   the first stop partial surface is formed on a first stop element and the second stop partial surface is formed on a second stop element,
   the chip mounting surface is arranged between the first stop element and the second stop element,
   the stop surface is oriented perpendicularly to the chip mounting surface,
   a laser chip is arranged on the chip mounting surface,
   the laser component assembly has a lens bar comprising an optical lens per component portion, and
   the lens bar is arranged on the lens mounting surfaces of the component portions and bears against the stop surfaces of the component portions.

2. The laser component assembly as claimed in claim 1, wherein the lens bar is spaced apart from the laser chips.

3. The laser component assembly as claimed in claim 1, wherein the lens bar is a planoconvex lens, and
   a plane side of the lens bar faces the laser chips.

4. The laser component assembly as claimed in claim 3, wherein the lens bar is a planoconvex cylindrical lens, and
   an axis of curvature of the lens bar is oriented parallel to the chip mounting surfaces.

5. The laser component assembly as claimed in claim 1, wherein, in each component portion, the laser chip is an edge emitting laser chip, and
   a laser beam emitted by the laser chip has a higher beam divergence in a direction perpendicular to the chip mounting surface than in a direction parallel to the chip mounting surface.

6. The laser component assembly as claimed in claim 1, wherein, in each component portion, the chip mounting surface is oriented parallel to the lens mounting surface.

7. The laser component assembly as claimed in claim 1 wherein, in each component portion, the chip mounting surface is elevated relative to the lens mounting surface.

8. The laser component assembly as claimed in claim 1, wherein, in each component portion, a first metallization is arranged on the chip mounting surface, and
   the laser chip in each component portion electrically conductively connects to the respective first metallization.

9. The laser component assembly as claimed in claim 8, wherein, in each component portion, a metallization is arranged on the lens mounting surface, said metallization electrically conductively connecting to the respective first metallization.

10. The laser component assembly as claimed in claim 9,
    wherein the carrier has a second metallization in each component portion, said second metallization electrically insulated from the first metallization, and
    the laser chip in each component portion electrically conductively connects to the respective second metallization.

11. The laser component assembly as claimed in claim 8,
    wherein the carrier has a second metallization in each component portion, said second metallization electrically insulated from the first metallization, and
    the laser chip in each component portion electrically conductively connects to the respective second metallization.

12. A method of producing a laser component comprising:
    providing a carrier comprising a chip mounting surface, a further chip mounting surface, a lens mounting surface, a further lens mounting surface, a stop surface and a further stop surface;
    arranging a laser chip on the chip mounting surface and a further laser chip on the further chip mounting surface;
    arranging a lens bar comprising an optical lens and a further optical lens on the lens mounting surface and the further lens mounting surface, wherein the lens bar bears against the stop surface and against the further stop surface; and
    dividing the carrier and the lens bar to obtain a first laser component and a second laser component.

13. The method as claimed in claim 12, further comprising arranging an adhesive on the lens mounting surface before the lens bar is arranged on the lens mounting surface.

14. The method as claimed in claim 12, wherein the lens bar, after being arranged on the lens mounting surface, is pressed onto the stop surface and the further stop surface.

15. The method as claimed in claim 14, wherein the pressing-on is effected in a force-controlled manner.

16. The method as claimed in claim 14, wherein the pressing-on is effected in a distance-controlled manner.

17. The method as claimed in claim 16, wherein the lens bar is pressed onto the stop surface and the further stop surface by an elastically compliant tool.

* * * * *